United States Patent [19]

Shindo et al.

[11] Patent Number: 4,842,654
[45] Date of Patent: Jun. 27, 1989

[54] METHOD OF HEAT TREATMENT OF LOW MELTING-POINT METAL ON AN ELECTRODE OF A CHIP PART

[75] Inventors: Yasuhiro Shindo; Yukio Tsujimoto; Isami Saito, all of Fukui; Isamu Hiraoka, Akigawa; Hiroshi Hirayama, Tokyo, all of Japan

[73] Assignee: Matsushita Electric Industrial Co. Ltd., Japan

[21] Appl. No.: 145,403

[22] Filed: Jan. 19, 1988

[51] Int. Cl.[4] .................................................. C21D 1/50
[52] U.S. Cl. ............................ 148/20.6; 75/0.5 R; 75/0.5 B; 75/0.5 C; 148/127; 437/188; 437/202
[58] Field of Search ............. 75/0.5 R, 0.5 B, 0.5 C; 264/13, 15; 29/1.22; 437/188, 202; 148/20.6, 127

[56] References Cited

U.S. PATENT DOCUMENTS

| | | |
|---|---|---|
| 2,952,868 | 9/1960 | Rowon .................................. 264/15 |
| 3,019,485 | 2/1962 | Diamond .............................. 264/15 |
| 3,063,099 | 11/1962 | Turner et al. ......................... 264/15 |
| 3,708,560 | 1/1973 | Mayer et al. .......................... 264/13 |

FOREIGN PATENT DOCUMENTS

| | | |
|---|---|---|
| 0233922 | 6/1960 | Australia ............................... 264/15 |
| 0641010 | 5/1962 | Canada ............................... 75/0.5 B |
| 0662957 | 5/1963 | Canada ................................ 264/15 |
| 0147001 | 7/1985 | European Pat. Off. . |
| 3104419 | 8/1982 | Fed. Rep. of Germany . |
| 3328342 | 1/1985 | Fed. Rep. of Germany . |
| 56-84401 | 12/1981 | Japan . |
| 904211 | 1/1975 | United Kingdom . |
| 1536772 | 12/1978 | United Kingdom . |
| 925128 | 2/1985 | United Kingdom . |

*Primary Examiner*—L. Dewayne Rutledge
*Assistant Examiner*—David W. Schumaker
*Attorney, Agent, or Firm*—Stevens, Davis, Miller & Mosher

[57] ABSTRACT

Disclosed is a method of heat treatment of a low melting-point metal for production of spheroidal bodies formed of a low melting-point metal or alloy or heat treatment of the low-melting point metal coated on the surface of an electrode of a chip part. The method comprises the steps of placing a high boiling-point liquid, such as oil, into a tubular container disposed vertically and provided with a heater at an upper portion thereof, the high boiling-point liquid being provided with a temperature gradient ranging from a high temperature above the melting point of the metal to be subjected to heat treatment to a low temperature below the melting point thereof; and allowing the low melting-point metal or a low melting-point alloy per se or a material having the low melting-point metal or alloy on its surface to move from the high-temperature portion of the high boiling-point liquid; whereby the low melting-point metal or a low melting-point alloy per se or a material having the low melting-point metal or alloy on its surface is made to melt in the high-temperature portion and is cooled in the low-temperature portion, thereby allowing a melt or a molten portion to solidify.

9 Claims, 2 Drawing Sheets

METHOD OF HEAT TREATMENT OF LOW MELTING-POINT METAL ON AN ELECTRODE OF A CHIP PART

BACKGROUND OF THE INVENTION

The present invention relates to a method of heat treatment of a low melting-point metal for production of spheroidal bodies formed of a low melting-point metal or alloy (hereafter collectively referred to as the low melting-point metal) or heat treatment of conductor portions of electronic circuit boards used for electronic apparatus or land portions thereof where conductors or parts are mounted. More particularly, the present invention concerns a method of treating electrodes of chip parts, such as chip resistors, i.e., a kind of electronic parts, which is capable of contributing to the production of lightweight, thin, and compct electronic equipment.

Hitherto, a heat treatment method of this type has been conducted as described below. FIG. 1 is a diagram schematically illustrating an arrangement of a conventional jig for forming low melting-point metal balls. In the drawing, reference numeral 1 denotes a graphite plate; 2, a semispherical hole provided in the graphite plate 1; and 3, a low melting-point metal pellet placed in the hole 2. To describe a method of forming low melting-point metal balls using the jig shown in FIG. 2, the graphite plate 1 having a multiplicity of the semispherical holes 2 is prepared, the low melting-point metal pellets 3 are placed in the holes 2, and the graphite plate 1 thus placed in the graphite plate 1 is immersed in a high boiling-point liquid (not shown) having a temperature higher than the melting point of the low melting-point metal. When the low melting-point metal pellets 3 have melted, and lower portions thereof have become semispherical in conformity with the semispherical holes 2 provided in the graphite plate 1 and upper portions thereof have become semispherical due to the surface tension, the graphite plate 1 is removed from the high boiling-point liquid of a high temperature and the metal balls are allowed to solidify so as to obtain the low melting-point metal balls.

Meanwhile, as for a circuit board used in an electronic apparatus, one having a structure as shown in FIG. 2 is used. FIG. 2 is a perspective view of a circuit board used for, for instance, a composite part. In the drawing, reference numeral 4 denotes an insulating substrate; 5, a land to which an electronic part such as a chip is soldered; 6, a conductor for connecting lands; and 7, a land for soldering a terminal thereto. These lands 5, 7 and conductors 6 are disposed on the substrate 4. In a circuit board such as the one shown in FIG. 2 which is currently used, copper foils are in most cases used as the lands 5, 7 and conductors 6. Recently, a circuit board in which a film of a low melting-point metal, such as solder, is coated on the aforementioned copper foils has come to be used to improve the reliability of soldering. As a method of coating with this low melting-point metallic film, an electroplating method, a chemical plating method, or a method of immersing in a low melting-point metal is generally adopted. A circuit board coated with the low melting-point metallic film by such a method is used as it is without being subjected to heat treatment.

In such a conventional heat treatment method, when low melting-point metal balls shown in FIG. 1 are produced, the low melting-point metal pellets must be arranged with adquate intervals provided therebetween in such a manner that the metal pellets will not come into contact with each other when the metal pellets are melted. In addition, a pallet, such as the graphite plate having semispherical holes, is required to ensure that the low melting-point metal pellets will not adhere thereto, and the pellets must be placed into the holes one by one. This constitutes a major factor impeding mass production. Furthermore, although the low melting-point metal pellets are placed in the semispherical holes and are melted to produce the low melting-point metal balls, it is difficult to have the radius of curvature of a spherical surface formed by the semispherical hole conform with that of a spherical surface formed in an upper portion of the hole by the surface tension, so that there is a drawback in that balls with a desirable spherical shape cannot be obtained. Moreover, in terms of facilities, both an equipment for placing the low melting-point pellets into the semispherical holes in the pallet and another equipment for removal after heat treatment are required. As for heat treatment facilities, since the low melting-point pellets must be subjected to heat treatment together with the pallet, a large heating capacity is required, so that large-scale facilities are required as a whole.

In addition, a method of producing spheroidal metallic particles is disclosed in Japanese Patent Unexamined Publication No. 56-84401. This method of producing spheroidal metallic particles is effected as follows: As shown in FIG. 3, a heat insulating glass tube 8 is filled with a liquid 10, such as glycerin, which is capable of maintaining a liquid state even at a temperature higher than the melting point of metallic particles 9 and has reducing properties. Heaters 11, 11a, and 11b are wound around an outer periphery of the glass tube 8, an uppermost layer of the liquid 10 in the glass tube 8 is maintained at a temperature below the melting point of the metallic particles 9 by means of the uppermost heater 11. In addition, an intermediate layer of the liquid 10 is held at a temperature above the melting point of the metallic particles 9 by means of the intermediate heater 11a. Furthermore, the temperature of the liquid 10 is set by the lowermost heater 11b such as to gradually decline from the lower layer of the intermediate layer to the lower end of the glass tube 8 below the melting point of the metallic particles 9. Subsequently, the metallic particles 9 are poured into the liquid 10 from a hopper 12 above the glass tube 8.

Namely, in the uppermost layer whose temperature is held below the melting point of the metallic particles 9, the metallic particles 9 poured into the liquid 10 are separated from each other as each of them becomes completely wet with the liquid 10. The separated metallic particles 9 then fall further in the liquid 10, are heated and melted in the liquid 10 in the intermediate layer whose temperature is held above the melting temperature of the metallic particles 9, and are formed into spheroidal metallic particles 9a by virtue of the surface tension. The molten metallic particles 9a thus formed into the spheroidal shape further fall in the liquid 10, and solidify as they are in the spheroidal shape in the lowermost layer portion of the liquid 10 whose temperature is set below the melting point of the metallic particles 9 (9a). The metallic particles 9a thus solidified are collected in a collector 13 provided at a lower end of the glass tube 8. Subsequently, these spherical metallic particles 9a are taken out, and glycerin or the like adhering to their particle surfaces is washed away to obtain granular metallic particles having smooth, glossy surfaces which are free from unevenness and cracks.

According to this method, however, there have been the following problems. First, the arrangement is very complicated since the temperature gradient of the liquid is such that, as compared with the melting point of the metallic particles, the liquid temperature gradient provided from the upper portion of the glass tube downward is in twin set to become a temperature below the melting point, another temperature above the melting point, and still another temperature below the melting point (and another temperature further below that temperature). Furthermore, the heating devices become complicated in order to form such a temperature gradient, a number of such units are required. In other words, this method has had a serious drawback in that the temperature gradient from the uppermost portion to the lower portion of the glass tube is complicated, and means for controlling this temperature gradient are made complicated. Thus, there has been a problem in that efficiency in mass production is extremely poor.

Secondly, when a copper foil of a circuit board, such as the one shown in FIG. 2, is subjected to a low melting-point metallic film treatment, in the method of coating the copper foil with the low melting-point metallic film by electroplating or chemical plating, the wettability of solder is good and soldering can be effected without any trouble insofar as soldering is effected within a fixed period of time after plating. According to these plating methods, however, the surfaces of the low melting-point metallic films are coarse, and their surface areas are very large. For this reason, these films are liable to adsorb foreign substances and gases, and if they are stored for a long period of time, the low melting-point metal surfaces undergo chemical change such as oxidation. Hence, such a method disadvantageously has a large possibility of causing faulty soldering at the time of soldering electronic parts or the like. Meanwhile, according to a method of immersing in a molten low-temperature metal, the thickness of the low melting-point metallic film becomes quite nonuniform. Hence, this metod has a serious drawback in that faulty mounting of parts occurs due to the excessive thickness when parts such as chips are actually mounted on the circuit boards.

Incidentally, if the low melting-point metal plated film is constituted by a glossy plating, solderability is poor since impurities (organic substances) are contained therein, so that this method is also fraught with a serious drawback.

SUMMARY OF THE INVENTION

Accordingly, it is a primary object of the present invention to provide a method of producing low melting-point metal balls that are close to spheres by very simplified facilities, thereby overcoming the drawbacks of the conventional methods of heat treatment of low melting-point metals.

Another object of the present invention is to provide a method of heat treatment for coating copper foils on lands or the like of circuit boards or electrode portions of cordless chip parts with low melting-point metallic films which have uniform thickness and smooth surfaces as well as small surface areas and are capable of ensuring reliability in soldering for a long period of storage.

Still another object of the present invention is to provide a chip part coated with such a low melting-point metallic film.

To these ends, according to one aspect of the present invention, there is provided a method of heat treatment of a low melting-point metal, comprising the steps of: placing a high boiling-point liquid, such as oil, into a tubular container disposed vertically and provided with a heater at an upper portion thereof, the high boiling-point liquid being provided with a temperature gradient ranging from a high temperature above the melting point of the metal to be subjected to heat treatment to a low temperature below the melting point thereof; and allowing the low melting-point metal or a low melting-point alloy per se or a material having the low melting-point metal or alloy on its surface to move from a high-temperature portion to a low-temperature portion of the high boiling-point liquid; whereby the low boiling-point metal or a low melting-point alloy per se or a material having the low melting-point metal or alloy on its surface is made to melt in the high-temperature portion and is cooled in the low-temperature portion, thereby allowing a melt or a molten portion to solidify.

In addition, any one of vegetable oil, animal oil, mineral oil, synthetic silicone oil, or glycerin may be used as a preferred form of the high boiling-point liquid.

According to this arrangement, since the low melting-point metal pellets are melted by the high-temperature portion of the high boiling-point liquid in the container and are cooled by the low-temperature portion thereof, a force which contributes to the formation of the low melting-point metal pellets into the spheroidal shape by means of the surface tension acts on the low melting-point metal pellets, and peripheral portions thereof are supported by the high boiling-point liquid alone, and the pressure of the liquid acts uniformly on the low melting-point metal pellets. Accordingly, the metal pellets are formed into the spheroidal shape which is very close to the spherical shape. In addition, since a liquid which has the function of flux, such as oil including natural vegetable oil and glycerin, is used as the high boiling-point liquid, no flux is used, so that the surfaces of the metal pellets are not subject to oxidation. Moreover, since foreign substances and gases which have been adsorbed by the surfaces of the metal pellets or occluded in their cavities are released, the surfaces are clean, smooth and substantially free of impurities. Furthermore, by way of heat treatment, the low melting-metal pellets are allowed to move in the high boiling-point liquid from the high-temperature portion to the low-temperature portion. Hence, this method can be implemented simply without using complicated facilities. In addition, since the melting and cooling are thus carried out in the high boiling-point liquid and the low melting-point metal balls do not adhere to each other in the low-temperature portion, it is possible to effect treatment simply by pouring a large amount of the low melting-point metal pellets in a loose state without needing to be arranged at the time of heat treatment. In addition, since the low melting-point metal pellets are in direct contact with the liquid, heating and cooling are completed within a short time, the efficiency in mass production becomes very high.

Similarly, the low melting-point metal films coated on copper foils of the circuit boards by plating or the like are melted and cooled in the same way as the above-described low melting-point metal pellets. As a result, the surface tension acts on the metal films at the time of melting, so that their surface areas become much smaller than those obtained at the time of plating, and their surfaces become smoother. Accordingly, an amount of foreign substances or gases adsorbed or occluded during storage becomes extremely small. Furthermore, foreign substances adsorbed by the surfaces or occluded in the cavities are released, the low melting-point metallic films per se on the surfaces are turned into clean films which do not contain impurities. This contributes to improvement of the wettability of solder and soldering reliability. Moreover, with respect to facilities, since the same facilities as those for producing the above-described low melting-point metal balls can be used to effect heat treatment, and simple facilities can be used, and the efficiency in mass production can be enhanced.

DESCRIPTION OF THE PREFERRED EMBODIMENTS

Referring now to the accompanying drawings, a description will be given of an embodiment of the present invention.

Figure 4:
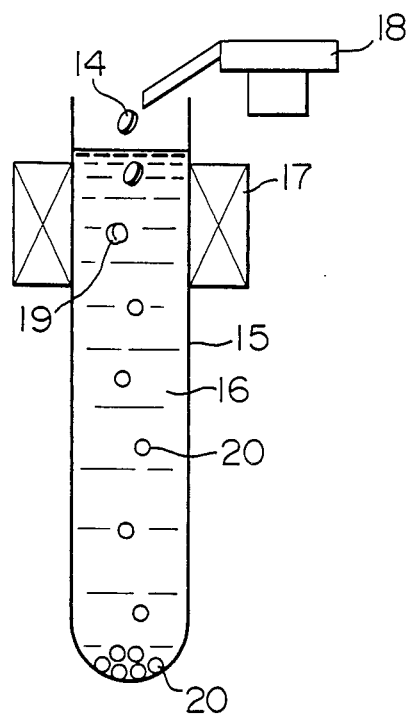
FIG. 4 is a diagram schematically illustrating an embodiment of an apparatus for implementing a method of heat treatment of a low melting-point metal in accordance with the present invention.

FIG. 4 is a diagram schematically illustrating an embodiment of an apparatus for implementing a method of heat treatment for producing low melting-point metal balls in accordance with the present invention. In the drawing, a solder pellet 14 is a low melting-point metal pellet such as the one designated at reference numeral 3 in FIG. 1. A glass-made tubular container 15 has a length of, say, about 160 cm (approx. 63 inches) and an inside diameter of, say, 9 cm (approx. 3.54 inches), and is disposed vertically. Palm oil 16, i.e., a natural vegetable oil, is placed in the container 15. A heater 17 is a mantle heater or the like disposed on an outer periphery of an upper portion of the tubular container 15. A parts feeder 18 is adapted to pour the solder pellets 14 from an upper opening of the tubular container 15 into the container 15.

As mentioned above, in this embodiment the tubular container 15 is disposed vertically, which constitutes a basic arrangement of the apparatus for implementing a method of the present invention.

EXAMPLE 1

A description will now be given of a method of heat treatment for producing solder balls using the apparatus shown in FIG. 4. First, an upper portion of the glass-made tubular container 15 was heated to 250° 14 280° C. by the heater 17. At that time, the palm oil 16 in the tubular container 15 was heated to 250°-280° C. The specific gravity of the palm oil 16 thus heated becomes small, and this portion of the heated palm oil 16 did not circulate by convection to a low-temperature portion whose specific gravity is large, and convection occurred only in the upper portion of the palm oil 16. As a result, a temperature gradient in which the temperature shifts from a high-temperature state in the uppermost portion toward a low-temperature state in the lowermost portion was created in the palm oil 16 in the tubular container 15, thereby allowing the bottom side to substantially maintain a room temperature. In this state, the solder pellets 14 were poured from the parts feeder 18 above the liquid level of the palm oil 16 into the tubular container 15. The solder pellet 14 used in this example was formed by tin and lead with a ratio of Sn to Pb being 60:40 and had a thickness of 0.6 mm (0.024 inch) and a diameter of 2 mm (approx. 0.079 inch), a melting point thereof being 180°-190° C. The solder pellets 14 of the above-described specifications were allowed to drop from the parts feeder 18 onto the surface of the heated palm oil 16 at a rate of 250 pieces minute. Consequently, each of the solder pellets 14 struck against the surface of the palm oil 16 and fell in the palm oil 16. At this time, the solder pellets 14 fell in an individually separated state due to friction between the palm oil 16 and the solder pellets 14, and the solder pellets 14 were turned into melts 19 in the high-temperature portion heated to 250° 280° C. These melts 19 become spheroidal due to both the surface tension of the solder itself and uniform pressure from the surrounding palm oil 16 as well as the high viscosity of the palm oil 16. These spheroidal melts 19 fell into the low-temperature portion provided with the temperature gradient, and solidified at a point where they passed through a portion of the palm oil 16 whose temperature was about 180° C. Solder balls 20 which were close to spheres having smooth surfaces and a diameter of about 1.53 mm (0.06 inch) were accumulated in the bottom portion of the tubular container 15. At that time, since the temperature of the bottom portion of the tubular container 15 was held substantially at room temperature, there is no possibility of the solder balls 20 adhering to each other even if they were brought into contact with each other.

As for a method of taking out the solder balls 20, it is conceivable to adopt a method whereby the solder balls 20 are removed from the pellet charging port after the high-temperature portion of the palm oil 16 is withdrawn, or a method whereby, after a plug is provided in the bottom portion of the tubular container 15, the solder balls 20 are taken out together with the palm oil 16 when the plug is opened. The production of the solder balls 20 was thus effected.

Although, in the above-described example, a description has been given of a case where palm oil, i.e., a natural vegetable oil, was used as the high boiling-point liquid, a material having the function of flux, such as natural animal oil, natural mineral oil, synthetic silicone oil, or glycerin may be used as the high boiling-point liquid which produces a similar effect. Furthermore, the high boiling-point liquid is not restricted to these, and any one which has a boiling point higher than the melting point of the low melting-point metal may be used.

However, if an overall evaluation is made of such aspects of the non-pollution, boiling point, specific gravity, viscosity, and features of flux, it has been confirmed through experiments conducted by the present inventors that the palm oil, i.e., a natural vegetable oil, is best suited to the treatment method of the present invention as the high boiling-point liquid. In addition, generally known tin and lead may be used as the low melting-point metal material in addition to the solder mentioned in the above example.

EXAMPLE 2

Figure 2:
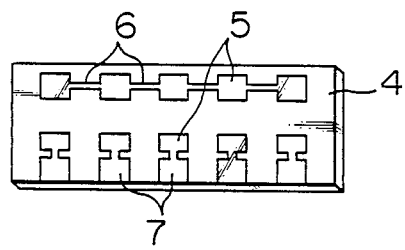
FIG. 2 is a perspective view illustrating an example of a circuit board for a composite part, which is a kind of electronic circuit board.
Figure 3:
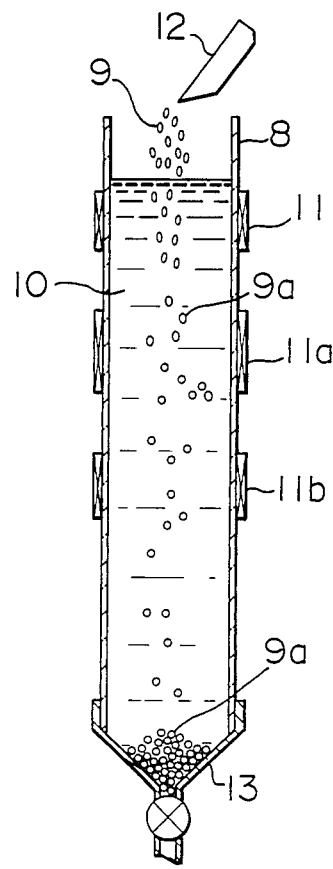
FIG. 3 is a diagram schematically illustrating a conventional apparatus for implementing a method of producing spheroidal metallic particles.

Next, circuit boards for composite parts, such as the one shown in FIG. 2, which has as a circuit an about 30 μm-thick copper foil and an about 10 μm-thick solder film coating (Sn:Pb=60:40) deposited on the copper foil by electroplating, were poured from above the liquid level of the palm oil 16 in the tubular container 15 at a rate of 1 piece/5 sec. In this example, the same tubular container 15 as that of the above-described example was used, and the other conditions were set in a similar manner. Upon pouring these circuit boards, the solder films deposited on the copper foils by electroplating melted in the upper high-temperature portion of the palm oil 16, and the circuit boards which solidifed in the lower low-temperature portion were accumulated in the bottom of the tubular container 15. With respect to the taking-out of these circuit boards for composite parts, it is necessary to devise a measure as compared with the foregoing example, but, basically, the removal can be effected in a similar manner. After the discharging of the high-temperature palm oil, a microscopic observation was made of the surfaces of the removed circuit boards. The microscopic observation revealed that, although their surfaces as it is coated with the plating films were coarse and severely uneven with their surface areas being large, those which were provided with the heat treatment in the above-described example became very smooth surfaces with their surface areas being small because the surfaces of the solder films were melted once. In addition, it was confirmed that their thickness was maintained at a uniform thickness due to the fact that the films were formed by electroplating.

EXAMPLE 3

Next, a description will be made of a method regarding the treating of an electrode surface for a chip part shown in FIG. 5.

Figure 5:
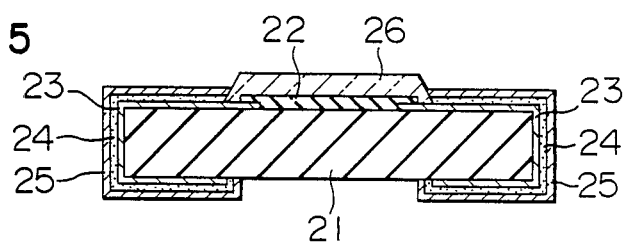
FIGS. 5 and 6 are cross-sectional views illustrating square-shaped chip resistors which are a kind of chip parts.

FIG. 5 is a cross-sectional view of a square-shaped chip resistor, by way of an example, and reference numeral 21 denotes an insulating substrate formed by such as alumina; 22, a resistor; 23, a silver-based electrode film; 24, a nickel (Ni) film; 25, a solder (a Sn-Pb alloy) (or tin (Sn) or lead (Pb)) film deposited by electroplating; and 26, a glass coating for protecting the resistor 22.

The chip part used in this example is a squareshaped chip resistor, and its electrode portion comprises electroplated film layers having a thickness of 7-10 μm and including a lowermost layer formed of Ag-Pd, an intermediate layer formed of Ni, and an outermost layer (a low melting-point metallic plated film) formed of solder (Sn:Pb=60:40). The melting point of the outermost layer material is 180°-190° C.

The chip parts of the above conditions were allowed to drop to the surface of the heated palm oil 16 at a rate of 250 pieces min, using the parts feeder 18. As a result, the chip parts came into contact with the surface of the palm oil 16 and further fell in the palm oil 16. At this juncture, the chip parts fell in an individually separated state due to the friction between the palm oil 16 and the chip parts. The Sn—Pb alloy-plating film, which is the outermost layer of the electrode, was melted in the high-temperature portion heated at 250°-280° C., and fell toward the low-temperature portion provided with a temperature gradient. After it had passed through a portion of the palm oil 16 whose temperature was below 180° C. or below, the molten portion solidified. These chip parts, which were provided with electrodes with smooth surfaces, were accumulated in the bottom portion of the tubular container 15. At that time, since the bottom portion of the tubular container 15 was held substantially at room temperature, even if the chip parts come into contact with each other, there was no possibility of the electrodes adhering to each other. With respect to a method of taking out the chip parts for which the electrode surface treatment has been completed, it is conceivable to adopt a method whereby the chip parts are taken out from a parts charging port after the high-temperature portion of the palm oil 16 is withdrawn, or a method whereby, after a plug is provided in the bottom portion of the tubular container 15, the chip parts are taken out together with the palm oil 16 when the plug is opened. The melting treatment of the low melting-point metal plated films of chip parts was thus effected.

EXAMPLE 4

Figure 1:
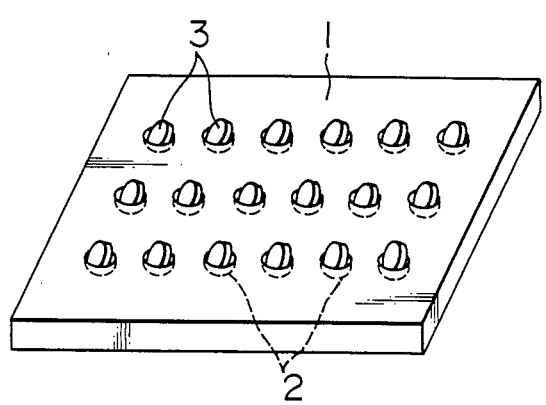
FIG. 1 is a diagram schematically illustrating a jig for producing low melting-point metallic spheroidal bodies in accordance with a conventional method.
Figure 6:
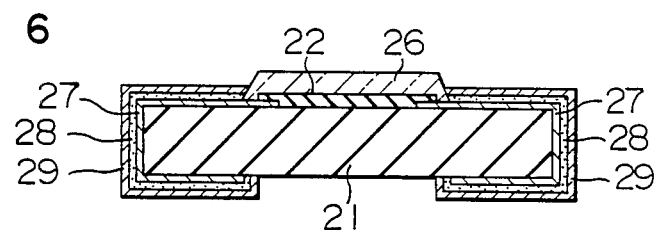

A description will now be made of a method of treating the surface of an electrode part of a chip part shown in FIG. 6 using the apparatus shown in FIG. 1. In the chip part shown in FIG. 6, the arrangement of parts other than the electrode portion are the same as that of those of FIG. 5.

The chip part used in this example is a square-shaped chip resistor, and its electrode portion comprises a lowermost layer constituted by an Ag—Pd layer 27, an intermediate layer constituted by a Cu layer 28, and an outermost layer (a low melting-point metallic paste layer) constituted by a coated and dried layer 29 of solder (Sn:Pb=60:40) with a thickness of 50-100 μm. In addition, the melting point of the outermost layer material is 180°-190° C.

The chip parts of the above specifications were allowed to drop to the surface of the heated palm oil 16 at a rate of 250 pieces/min, using the parts feeder 18. As a result, the chip parts came into contact with the surface of the palm oil 16 and further fell in the palm oil 16. At this juncture, the chip parts fell in an individually separated state due to the friction between the palm oil 16 and the chip parts. The coated and dried Sn-Pb alloy paste layer, which is the outermost layer of the electrode, was melted in the high-temperature portion heated at 250°-280° C., and fell toward the low-temperature portion provided with a temperature gradient. After it had passed through a portion of the palm oil 16 whose temperature is about 180° or below, the molten portion solidifed. These chip parts, which are provided with electrodes with smooth surfaces, were accumulated in the bottom portion of the tubular container 15. At that time, since the bottom portion of the tubular container 15 was held substantially at room temperature, even if the chip parts came into contact with each other, there was no possibility of the electrodes adhering to each other. With respect to a method of taking out the chip parts for which the electrode surface treatment had been completed, it is conceivable to adopt a method whereby the chip parts are taken out from a parts charging port after the high-temperature portion of the palm oil 16 was withdrawn, or a method whereby, after a plug is provided in the bottom portion of the tubular container 15, the chip parts are taken out together with the palm oil 16 when the plug is opened. The melting treatment of the low melting-point metal coated and dried layers of chip parts was thus effected.

The method of heat treatment of the low melting-point metals in accordance with the present invention is arranged as described above, and has numerous characteristic features. First of all, since the low melting-point metal is melted in the high-temperature portion of the high boiling-point liquid in the container and is cooled in the low-temperature portion thereof, the surface tension acts at the time of melting, the surface area becomes small, and its surface becomes smooth, so that an amount of foreign substances adhering thereto during storage becomes very small. In addition, in cases where the low melting-point metal is deposited on the surface of another material as a plated film, foreign substances and gases adhering to its surface or occluded in its cavities are released, so that the film becomes clean with a small amount of impurities attached thereto. In addition, to effect heat treatment, the low melting-point metal merely moves from the high-temperature portion of the high boiling-point liquid into the low-temperature portion thereof, so that heat treatment can be implemented simply without using any complicated facilities. Furthermore, since the melting and cooling are thus effected in the high boiling-point liquid, and the pieces of the low melting-point metal do not adhere to each other in the low-temperature portion, it is possible to effect treatment simply by charging the low melting-point metal pellets in large quantities in a loose state without needing to arranging them at the time of electrode treatment. Moreover, since the low melting-point metal is in contact with the liquid, the heating and cooling can be completed within a short time, thereby making it possible to remarkably enhance the heat treatment efficiency. Furthermore, since the low melting-point metal does not come into contact with the air, there is no risk of the electrode surface from becoming oxidized even when it is melted. In addition, since the melting treatment is performed in a liquid, pressure is applied from the surroundings to the molten metal since the specific gravity of the high boiling-point liquid which is in contact with the low melting-point metal is large as compared with air and its viscosity is large. As a result, the surface of the molten metal does not become corrugated and assumes a smooth surface. In the case of low melting-point pellets, the pellets become spheroids which are close to spheres. The thickness of the low melting-point metallic film plated on the surface of another substance is made uniform. Further, since a liquid having the function of flux such as oil including natural vegetable oil or glycerin is used as the high boiling-point liquid, flux is not required, so that facilities can be simplified, and the cleaning of the low melting-point metal treated is remarkably facilitated. In particular, when palm oil, which is a natural vegetable oil, favorable results are obtained in all such aspects as the non-pollution, specific gravity, viscosity, and features of flux, as described above.

Furthermore, the advantages of the present invention are enumerated below.

(1) Since low melting-point metal pellets or articles having the low melting-point metal on their surfaces can be charged without needing to be arranged, it is possible to effect treatment in the same facilities regardless of their size. In addition, it is possible to treat articles having different sizes.

(2) Since treatment can be effected without using flux, cleaning is facilitated, and there is no seizure of flux, so that the articles can be produced with a fine finish.

(3) Since the heat medium used is the high boiling-point liquid, the accuracy of the temperature control is high. Since the high boiling-point liquid and the low melting-point metal pellets or articles having the same on their surfaces are in contact with each other, heat conductance takes place speedily, the treatment of melting and solidification is effected within a short time, and the reliability of the melting treatment is high. Namely, the treated products are free from melting failures.

(4) Since the high boiling-point liquid is provided with a temperature gradient from the upper portion to the bottom portion, it is possible to accumulate treated low melting-point metal pieces or articles having the low melting-point metal on their surfaces in heaps at a time. Thus, it is possible to take out the treated products in a bulk at a time, so that the taking-out work can be simplified appreciably.

(5) If the kind or specific gravity of the high boiling-point liquid is selected, it is possible to change the time duration when the low melting-point metal pieces or articles having the same on their surfaces pass through the liquid. Furthermore, since the specific gravity changes if the temperature gradient of the high boiling-point liquid is altered, it is possible to similarly change the time duration when the low melting-point metal pieces or articles having the same on their surfaces pass through the liquid. As a result, it is readily possible to cope with a change in the kind or size of the low melting-point metal pieces or articles having the same on their surfaces.

(6) Since there is no mechanically movable parts, the failure of the facilities is substantially nil, so that the operating efficiency can be improved remarkably.

What is claimed is:

1. A method of heat treatment of an electrode of a chip part, comprising the steps of:
    placing a high boiling-point liquid into a tubular container;
    providing said high boiling-point liquid in said container with a temperature gradient;
    allowing a chip part having in an electrode portion thereof both a high melting-point metallic film or a high melting-point alloy film as a substrate layer thereof and a low melting-point metallic film or a low melting-point alloy film in an outermost layer thereof to move from a high-temperature portion to a low-temperature portion of the temperature gradient of said high boiling-point liquid;
    whereby said low melting-point metallic film or said low melting-point alloy film of said electrode portion is made to melt in said high-temperature portion and is cooled in said low-temperature portion, thereby allowing a melt or a molten portion thereof to solidify.

2. A method of heat treatment of an electrode of a chip part according to claim 1, wherein said high boiling point liquid is one selected from the group consisting of vegetable oil, animal oil, mineral oil, synthetic silicone oil, and glycerin.

3. A method of heat treatment of an electrode of a chip point according to claim 1, wherein tin or lead is used as said low melting-point metal.

4. A method of heat treatment of an electrode of a chip part according to claim 1, wherein solder is used as said low melting-point metal.

5. A method of heat treatment of an electrode of a chip part according to claim 1, wherein said low melting-point metal or alloy disposed on said other material is formed by electroplating or chemical plating.

6. A method of heat treatment of an electrode of a chip part, comprising the steps of:
    placing a high boiling-point liquid into a tubular container;
    providing said high boiling-point liquid in said container with a temperature gradient;
    allowing a chip part having in an electrode portion thereof both a solderable metallic film or alloy film as a substrate layer thereof and a low melting-point metallic paste or a low melting-point alloy paste in an outermost layer thereof to move from a high-temperature portion to a low-temperature portion of the temperature gradient of said high boiling-point liquid;
    whereby a low melting-point metal coated and dried layer or a low melting-point alloy coated and dried layer of said electrode portion is made to melt in said high-temperature portion and is cooled in said low-temperature portion, thereby allowing a melt thereof to solidify.

7. A method of heat treatment of an electrode of a chip part according to claim 6, wherein a tin paste or a lead paste is used as said low melting-point metallic paste.

8. A method of heat treatment of an electrode of a chip part according to claim 6, wherein a solder paste is used as said low melting-point alloy paste.

9. A method of heat treatment of an electrode of a chip part according to claim 7, wherein said high boiling point liquid is one selected from the group consisting of vegetable oil, animal oil, mineral oil, synthetic silicone oil, and glycerin.

* * * * *